United States Patent
Jeong et al.

(10) Patent No.: US 12,100,466 B2
(45) Date of Patent: Sep. 24, 2024

(54) MEMORY DEVICE INCLUDING ERROR CORRECTION DEVICE

(71) Applicant: SK hynix Inc., Gyeonggi-do (KR)

(72) Inventors: Jin Ho Jeong, Gyeonggi-do (KR); Dae Suk Kim, Gyeonggi-do (KR); Mun Seon Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 181 days.

(21) Appl. No.: 18/080,282

(22) Filed: Dec. 13, 2022

(65) Prior Publication Data

US 2024/0096437 A1    Mar. 21, 2024

(30) Foreign Application Priority Data

Sep. 16, 2022  (KR) ........................ 10-2022-0116842

(51) Int. Cl.
  *G11C 29/52* (2006.01)
  *G11C 7/10* (2006.01)
  *G11C 29/02* (2006.01)

(52) U.S. Cl.
  CPC ............ *G11C 29/52* (2013.01); *G11C 7/1039* (2013.01); *G11C 29/022* (2013.01)

(58) Field of Classification Search
  CPC ..... G11C 29/52; G11C 7/1039; G11C 29/022; G11C 29/76; G11C 29/42; G11C 2029/0411; G06F 11/10; G06F 11/1048; G06F 11/1044; G06F 30/32; G06F 2111/20; G06F 2117/12

USPC .................................................... 365/185.09
See application file for complete search history.

(56) References Cited

U.S. PATENT DOCUMENTS

| | | | |
|---|---|---|---|
| 8,069,377 B2 | 11/2011 | Singh | |
| 11,983,066 B2* | 5/2024 | Lee | .......... G06F 11/08 |
| 2022/0300370 A1* | 9/2022 | Song | ................... G06F 11/1044 |
| 2023/0113615 A1* | 4/2023 | Shin | ........................ G11C 29/52 |
| | | | 714/768 |
| 2023/0187008 A1* | 6/2023 | Takeda | ................. G11C 29/028 |
| | | | 365/185.09 |
| 2024/0055065 A1* | 2/2024 | Yamaki | ............ G11C 29/12005 |

FOREIGN PATENT DOCUMENTS

| | | |
|---|---|---|
| KR | 10-2014-0125981 A | 10/2014 |
| KR | 10-2022-0114299 A | 8/2022 |

* cited by examiner

*Primary Examiner* — Fernando Hidalgo
(74) *Attorney, Agent, or Firm* — IP & T GROUP LLP

(57) ABSTRACT

A memory device includes a plurality of first cell blocks configured to store first data; a second cell block configured to store second data; a third cell block configured to store third data; a repair information storage circuit configured to output, based on repair information stored therein, a repair use signal corresponding to an input address; and an error correction circuit configured to: receive the second data as a first error correction code from the second cell block while selectively receiving, according to the repair use signal, the third data as a second error correction code from the third cell block, and correct errors in the first data from the first cell blocks using the first and second error correction codes.

22 Claims, 16 Drawing Sheets

FIG. 5A

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1 | 1 | 1 | 0 | 1 | 1 | 1 | 1 | 1 | 0 | 0 | 0 |
| 1 | 1 | 0 | 1 | 1 | 0 | 0 | 1 | 0 | 1 | 0 | 0 |
| 1 | 0 | 1 | 1 | 0 | 1 | 0 | 1 | 0 | 0 | 1 | 0 |
| 0 | 1 | 1 | 1 | 0 | 0 | 1 | 1 | 0 | 0 | 0 | 1 |

FIG. 5B

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1*D0 | 1*D1 | 1*D2 | 0*D3 | 1*D4 | 1*D5 | 1*D6 | 1*D7 | 1*E0 | 0*E1 | 0*E2 | 0*E3 |
| 1*D0 | 1*D1 | 0*D2 | 1*D3 | 1*D4 | 0*D5 | 0*D6 | 1*D7 | 0*E0 | 1*E1 | 0*E2 | 0*E3 |
| 1*D0 | 0*D1 | 1*D2 | 1*D3 | 0*D4 | 1*D5 | 0*D6 | 1*D7 | 0*E0 | 0*E1 | 1*E2 | 0*E3 |
| 0*D0 | 1*D1 | 1*D2 | 1*D3 | 0*D4 | 0*D5 | 1*D6 | 1*D7 | 0*E0 | 0*E1 | 0*E2 | 1*E3 |

| DATA | | | | | | | | ECC | | | |
|---|---|---|---|---|---|---|---|---|---|---|---|
| 1 | 1 | 0 | 0 | 1 | 0 | 1 | 0 | 0 | 1 | 1 | 0 |
| 1*1 | 1*1 | 1*0 | 0*0 | 1*1 | 1*0 | 1*1 | 1*0 | 1*0 | 0*1 | 0*0 | 0*0 |
| 1*1 | 1*1 | 0*0 | 1*0 | 1*1 | 0*0 | 0*1 | 1*0 | 0*0 | 1*1 | 0*0 | 0*0 |
| 1*1 | 0*1 | 1*0 | 1*0 | 0*1 | 1*0 | 0*1 | 1*0 | 0*0 | 0*1 | 1*1 | 0*0 |
| 0*1 | 1*1 | 1*0 | 1*0 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 0 | 0 | 1 | 0 | 0 | 0 | 0 | 1 | 1 | 0 |
| 1*1 | 1*1 | 1*0 | 0*0 | 1*1 | 1*0 | 1*0 | 1*0 | 1*0 | 0*1 | 0*0 | 0*0 |
| 1*1 | 1*1 | 0*0 | 1*0 | 1*1 | 0*0 | 0*0 | 1*0 | 0*0 | 1*1 | 0*0 | 0*0 |
| 1*1 | 0*1 | 1*0 | 1*0 | 0*1 | 1*0 | 0*0 | 1*0 | 0*0 | 0*1 | 1*1 | 0*0 |
| 0*1 | 1*1 | 1*0 | 1*0 | 0*1 | 0*0 | 1*0 | 1*0 | 0*0 | 0*1 | 0*0 | 1*0 |

1*1+1*1+1*0+0*0+1*1+1*0+1*0+1*0+1*0+0*1+0*1+0*0 = 1

1*1+1*1+0*0+1*0+1*1+0*0+0*0+1*0+0*0+1*1+0*1+0*0 = 0

1*1+0*1+1*0+1*0+0*1+1*0+0*0+1*0+0*0+0*1+1*1+0*0 = 0

0*1+1*1+1*0+1*0+0*1+0*0+1*0+1*0+0*0+0*1+0*1+1*0 = 1

MEMORY DEVICE INCLUDING ERROR CORRECTION DEVICE

CROSS-REFERENCE TO RELATED APPLICATION

The present application claims the benefit of Korean Patent Application No. 10-2022-0116842, filed on Sep. 16, 2022, which is incorporated herein by reference in its entirety.

BACKGROUND

1. Field

Various embodiments of the present invention relate to a semiconductor design technology, and more particularly, to a memory device including a memory cell array including a redundancy cell block and an error correction code (ECC) cell block.

2. Description of the Related Art

In the early stage of a semiconductor memory industry, memory chips were produced with no defective memory cells through a semiconductor fabrication process. However, as the capacity of memory devices increases, it becomes difficult to fabricate a memory device having no defective memory cell. Currently, there is substantially no chance that a memory device can be fabricated without any defective memory cells. To address this issue, a repair method of replacing defective memory cells with redundant memory cells, or an error correcting method for correcting errors in a memory device using an error correction circuit is being used.

SUMMARY

Embodiments of the present invention are directed to a memory device capable of efficiently utilizing redundancy resources.

According to an embodiment of the present invention, a memory device includes a plurality of first cell blocks configured to store first data; a second cell block configured to store second data; a third cell block configured to store third data; a repair information storage circuit configured to output, based on repair information stored therein, a repair use signal corresponding to an input address; and an error correction circuit configured to: receive the second data as a first error correction code from the second cell block while selectively receiving, according to the repair use signal, the third data as a second error correction code from the third cell block, and correct errors in the first data from the first cell blocks using the first and second error correction codes.

According to an embodiment of the present invention, a memory device includes a memory cell array including a plurality of normal cell blocks, an error correction code (ECC) cell block and a redundancy cell block; and an error correction circuit configured to: receive data as a first error correction code from the ECC cell block while selectively receiving, according to a repair use signal indicating whether cells of the redundancy cell block are used in a repair operation, data as a second error correction code from the redundancy cell block, and correct errors in data read from the normal cell blocks using the first and second error correction codes.

According to an embodiment of the present invention, an error correction circuit includes an error correction code generation circuit configured to: generate first and second preliminary error correction codes using lower data and upper data among input data, respectively, and provide, according to a repair use signal, the first and second preliminary error correction codes respectively to first and second cell blocks or a result of a comparison between the first and second preliminary error correction codes to the first cell block; and an error correction circuit configured to: receive data read from the first cell block as a first error correction code while selectively receiving, according to the repair use signal, data read from the second cell block as a second error correction code, and correct errors in data read from third cell blocks using the first and second error correction codes.

According to an embodiment of the present invention, a memory device includes a group of cell blocks configured to store data and a first error correction code (ECC) of a predetermined size; a redundancy cell block configured to replace a defective cell block within the group while a control signal stays enabled, the group and the redundancy cell block sharing a word line; an ECC codec circuit configured to: generate, while the control signal stays enabled, the first ECC for the data to error-correct the data by the first ECC, and generate, while the control signal stays disabled, the first ECC for one part of the data and a second ECC for the other part of the data to error-correct the data by the first and second ECCs; and a control circuit configured to control, while the control signal stays disabled, the redundancy cell block to store the second ECC.

According to the embodiments of the present invention, the memory device may maximize the error correction capability without increasing the area by utilizing the unused redundancy resources as the error correction resources.

BRIEF DESCRIPTION OF THE DRAWINGS

FIGS. 5A to 5D are diagrams illustrating a check matrix of the error correction deice of FIG. 4 according to an embodiment of the present invention.

DETAILED DESCRIPTION

Figure 1:
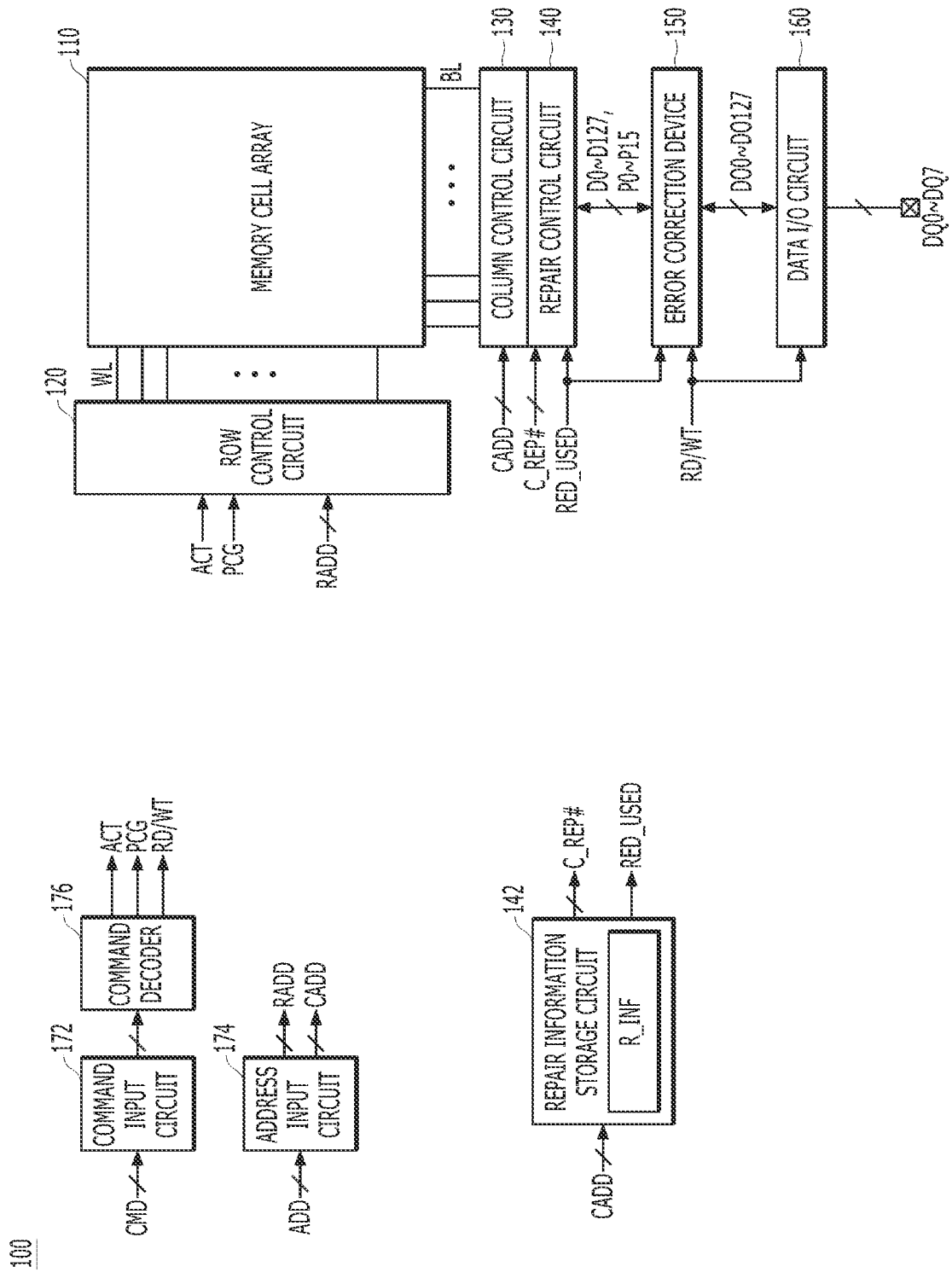
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating a memory device 100 in accordance with an embodiment of the present invention.

Referring to FIG. 1, the memory device 100 may include a memory cell array 110, a row control circuit 120, a column control circuit 130, a repair control circuit 140, a repair information storage circuit 142, an error correction device 150, a data input/output (I/O) circuit 160, a command input circuit 172, an address input circuit 174, and a command decoder 176.

The command input circuit 172 may receive a command CMD, and the address input circuit 174 may receive an address ADD, from an external device e.g., a memory controller. The address input circuit 174 may receive the address ADD and output a row address RADD and a column address CADD. Each of the command CMD and the address ADD may include a multi-bit signal. The command decoder 176 may decode the command CMD input through the command input circuit 172 and may generate an active command ACT, a precharge command PCG, a read command RD, a write command WT, and the like. The command decoder 176 may generate a refresh command, and a mode register command, as well as other commands, by decoding received commands CMD.

The memory cell array 110 may include a plurality of memory cells MC coupled to a plurality of word lines WL and a plurality of bit lines. The memory cell array 110 may include a plurality of banks. The number of banks or the number of memory cells MC may be determined depending on the capacity of the memory device 100.

The memory cell array 110 may be coupled to the row control circuit 120 through a plurality of word lines WL, and may be coupled to the column control circuit 130 through a plurality of bit lines BL. The memory cell array 110 may include a plurality of cell blocks. In an embodiment of the present invention, a plurality of cell blocks may include a plurality of normal cell blocks (MB0 to MB15 of FIG. 2), at least one error correction code (ECC) cell block (MBECC of FIG. 2), and at least one redundancy cell block (MBRED of FIG. 2).

The row control circuit 120 may activate the word line WL corresponding to the row address RADD according to the active command ACT and may precharge the activated word line WL according to the precharge command PCG.

The column control circuit 130 may select some bit lines from among the bit lines BL according to the column address CADD. For reference, a predetermined number of bit lines BL may be coupled to one column selection line (CSL of FIG. 2), and the column control circuit 130 may select at least one column selection line CSL from a plurality of column selection lines according to the column address CADD. As the bit lines are selected by the column control circuit 130, data D0 to D127 and error correction codes P0 to P15 may be read from the memory cell array 110 or written to the memory cell array 110.

The repair information storage circuit 142 may store, as repair information R_INF, addresses of defective cells of the normal cell blocks MB0 to MB15 and the ECC cell block MBECC. In this disclosure, an address indicating defective cells may be referred to as a defective address. The repair information storage circuit 142 may provide a plurality of block repair signals C_REP # and a repair use signal RED_USED corresponding to the column address CADD based on the stored repair information R_INF. The plurality of block repair signals C_REP # are signals provided to control a repair operation and may be provided in a number corresponding to the number of normal cell blocks MB0 to MB15 and the ECC cell block MBECC (i.e., #=17). The repair use signal RED_USED may be a signal indicating whether cells of the redundancy cell block MBRED designated by the column address CADD are used in the repair operation. A detailed configuration of the repair information storage circuit 142 will be described with reference to FIG. 3.

The repair control circuit 140 may transfer the data D0 to D127 and the error correction codes P0 to P15 between the column control circuit 130 and the error correction device 150, while selectively switching data lines transferring the data D0 to D127 and the error correction codes P0 to P15, according to the block repair signals C_REP # and the repair use signal RED_USED.

The error correction device 150 may generate the error correction codes P0 to P15 using 128-bit data DO0 to DO127 provided from the data I/O circuit 160 through data pads DO0 to DO7 during a write operation. In addition, the error correction device 150 may correct errors of the data D0 to D127 provided from the memory cell array 110 using the error correction codes P0 to P15 provided from the memory cell array 110 through the repair control circuit 140 during a read operation. The data DO0 to DO127 in which the error is corrected by the error correction device 150 may be output to the outside through the data pads DO0 to DO7 by the data I/O circuit 160. In an embodiment of the present invention, the error correction device 150 may adjust an error correction ability by adjusting a size of the error correction codes P0 to P15 according to the repair use signal RED_USED. In the following description, the error correction codes P0 to P7 of a lower bit group are defined as first error correction codes, and the error correction codes P8 to P15 of an upper bit group are defined as second error correction codes. A detailed configuration of the error correction device 150 will be described with reference to FIGS. 4 to 8.

The data I/O circuit 160 may input/output the data DO0 to DO127 through the data pads DO0 to DO7. A unit of 16-bit data may be input through one data pad during the write operation, and a unit of 16-bit data may be output through one data pad during the read operation. When eight data pads DO0 to DO7 are disposed in the memory device 100, the 128-bit data DO0 to DO127 may be input to the memory device 100 during the write operation, and the 128-bit data DO0 to DO127 may be output from the memory device 100 during the read operation.

Figure 2:
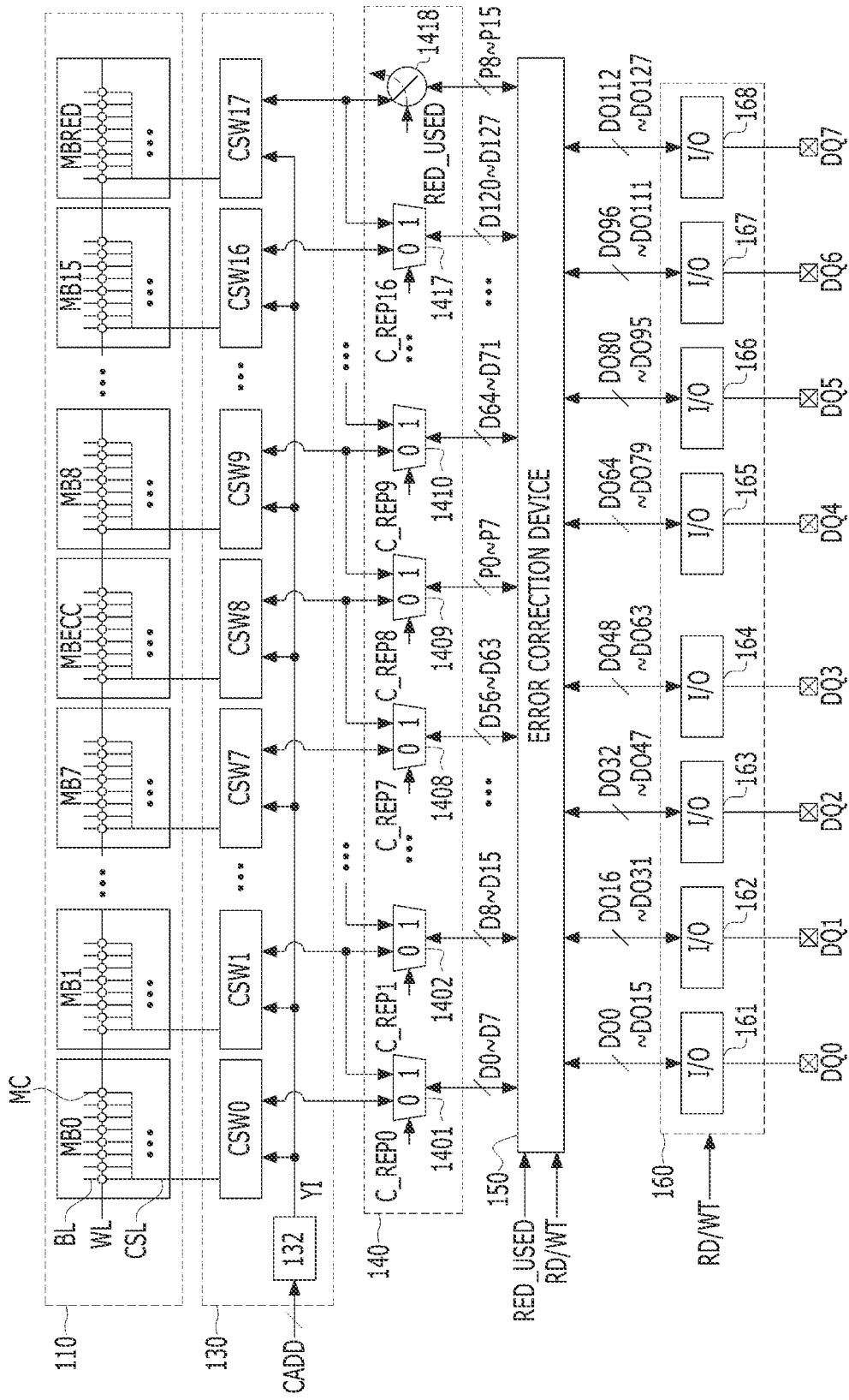
FIG. 2 is a diagram illustrating configurations of a memory device in more detail according to an embodiment of the present invention.

FIG. 2 is a diagram illustrating configurations of a memory device 100 in more detail according to an embodiment of the present invention.

Referring to FIG. 2, the memory cell array 110 may include a plurality of cell blocks MB0 to MB15, MBECC, and MBRED. Each of the cell blocks MB0 to MB15, MBECC, and MBRED may include a plurality of memory cells MC arranged in an array form between a plurality of word lines WL and a plurality of bit lines BL, respectively. In an embodiment of this invention, the "cell block" may be defined as a set of memory cells that share the word lines WL and the bit lines BL and are arranged in the same form.

The cell blocks MB0 to MBECC, and MBRED may include first to 16-th normal cell blocks MB0 to MBR15, an ECC cell block MBECC, and a redundancy cell block MBRED. The first to 16-th normal cell blocks MB0 to MB15 may store data D0 to D127 received from an external device through the data I/O circuit 160. The first to 16-th normal cell blocks MB0 to MB15 may be regions for storing user data, and are memory blocks for determining a memory capacity of the memory device 100. The ECC cell block MBECC may store the first error correction codes P0 to P7 generated by the error correction device 150 for an error correction operation. The redundancy cell block MBRED may be provided for a repair operation of the first to 16-th normal cell blocks MB0 to MB15 and the ECC cell block MBECC, and may include a plurality of redundancy cells (e.g., a plurality of redundancy bit lines) to replace defective cells (e.g., a plurality of defective bit lines) among the first to 16-th normal cell blocks MB0 to MB15 and the ECC cell block MBECC. In an embodiment of the present invention, when the redundancy cell block MBRED is not used in the repair operation, the repair use signal RED_USED is deactivated, and thus the redundancy cell block MBRED may store the second error correction code P8 to P15 generated from the error correction device 150 for the error correction operation. The first error correction codes P0 to P7 and the second error correction codes P8 to P15 may include known parity bits.

In FIG. 2, one ECC cell block MBECC and one redundancy cell block MBRED are illustrated, but the present invention is not limited thereto, and one or more ECC cell blocks MBECC and redundancy cell blocks MBRED may be disposed. The normal cell blocks MB0 to MB15 may be divided into first to eighth normal cell blocks MB0 to MB7 corresponding to an upper group, and ninth to 16-th normal cell blocks MB8 to MB15 corresponding to a lower group. In this case, the first to eighth normal cell blocks MB0 to MB7, the ECC cell block MBECC, the ninth to 16-th normal cell blocks MB8 to MB15 and the redundancy cell block MBRED may be sequentially arranged in a row direction.

The column control circuit 130 may include a column decoder 132 and first to 18-th column switches CSW0 to CSW17. The column decoder 132 may decode the column address CADD to generate a column selection signal YI. The first to 18-th column switches CSW0 to CSW17 may correspond to the first to eighth normal cell blocks MB0 to MB7, the ECC cell block MBECC, the ninth to 16-th normal cell blocks MB8 to MB15, and the redundancy cell block MBRED, respectively. Each of the first to 18-th column switches CSW0 to CSW17 may select one of the column selection lines CSL of the corresponding cell block according to the column selection signal YI. As one of the column selection lines CSL is selected, a predetermined number (e.g., 8) of bit lines may be selected. According to an embodiment, the column control circuit 130 may further include a sense amplifier circuit that senses and amplifies data of the selected column selection line according to a read command RD, and a write driver that writes data to the memory cell array 110 through the selected column selection line according to a write command WT.

The repair control circuit 140 may include first to 17-th path selectors 1401 to 1417 corresponding to the first to eighth normal cell blocks MB0 to MB7, the ECC cell block MBECC, and the ninth to 16-th normal cell blocks MB8 to MB15, respectively. The first to 17-th path selectors 1401 to 1417 may transfer the data D0 to D127 and the first error correction codes P0 to P7 between the corresponding cell blocks and one of the next cell blocks adjacent in the row direction in response to the first to 17-th block repair signals C_REP0 to C_REP16, respectively.

For example, during the read operation, the first path selector 1401 may transfer the data D0 to D7 output from the first normal cell block MB0 to the error correction device 150 when the first block repair signal C_REP0 is deactivated to a logic low level, and transfer the data D0 to D7 output from the second normal cell block MB1 to the error correction device 150 when the first block repair signal C_REP0 is activated to a logic high level. During the write operation, the first path selector 1401 may transfer the data D0 to D7 provided from the error correction device 150 to the first normal cell block MB0 when the first block repair signal C_REP0 is deactivated, and may transfer the data D0 to D7 from the error correction device 150 to the second normal cell block MB1 when the first block repair signal C_REP0 is activated.

For example, during the read operation, the ninth path selector 1409 may transfer the first error correction codes P0 to P7 output from the ECC cell block MBECC to the error correction device 150 when the ninth block repair signal C_REP8 is deactivated to a logic low level, and transfer the first error correction codes P0 to P7 output from the ninth normal cell block MB8 to the error correction device 150 when the ninth block repair signal C_REP8 is activated to a logic high level. During the write operation, the ninth path selector 1409 may transfer the first error correction codes P0 to P7 provided from the error correction device 150 to the ECC cell block MBECC when the ninth block repair signal C_REP8 is deactivated, and may transfer data D0 to D7 from the error correction device 150 to the ninth normal cell block MB8 when the ninth block repair signal C_REP8 is activated.

For example, during the read operation, the 17-th path selector 1417 may transfer the data D119 to D127 output from the 16-th normal cell block MB15 to the error correction device 150 when the 17-th block repair signal C_REP16 is deactivated to a logic low level, and transfer the data D119 to D127 output from the redundancy cell block MBRED to the error correction device 150 when the 17-th block repair signal C_REP16 is activated to a logic high level. During the write operation, the 17-th path selector 1417 may transfer the data D119 to D127 provided from the error correction device 150 to the 16-th normal cell block MB15 when the 17-th block repair signal C_REP16 is deactivated, and may transfer the data D119 to D127 from the error correction device 150 to the redundancy cell block MBRED when the 17-th block repair signal C_REP16 is activated.

The repair control circuit 140 may further include a path blocking switch 1418 for transferring the second error correction codes P8 to P15 between the redundancy cell block MBRED and the error correction device 150 in response to the repair use signal RED_USED. When the repair use signal RED_USED is activated to a logic high level, the path blocking switch 1418 may be turned off to block the transferring of the second error correction code P8 to P15 between the redundancy cell block MBRED and the error correction device 150. On the other hand, when the repair use signal RED_USED is deactivated to a logic low level, the path blocking switch 1418 may be turned on to transfer the second error correction code P8 to P15 between the redundancy cell block MBRED and the error correction device 150.

The data I/O circuit 160 may include first to eighth input/output (I/O) units 161 to 168 corresponding to data pads DO0 to DQ7 and for inputting/outputting the 128-bit data DO0 to DO127 through the data pads DO0 to DO7. Each of the first to eighth I/O units 161 to 168 may receive 16-bit data through a corresponding data pad during a write operation and output 16-bit data through a corresponding data pad during a read operation.

When the repair use signal RED_USED is activated, the error correction device 150 may generate the first error correction codes P0 to P7 of 8-bit using the 128-bit data DO0 to DO127 during the write operation, and correct the data D0 to D127 according to the first error correction codes P0 to P7 of 8-bit during the read operation. On the other hand, when the repair use signal RED_USED is deactivated, the error correction device 150 may generate the first and second error correction codes P0 to P7 and P8 to P15 of 16-bit using the 128-bit data DO0 to DO127 during the write operation, and correct the data D0 to D127 according to the first and second error correction codes P0 to P7 and P8 to P15 of 16-bit during the read operation.

As described above, in accordance with an embodiment of the present invention, when the redundancy cell block MBRED is not used for the repair operation, the size of the error correction codes used for the error correction operation may be increased by using the redundancy cell block MBRED to store additional error correction codes. Accordingly, the error correction capability may be maximized without an additional increase in area.

Figure 3:
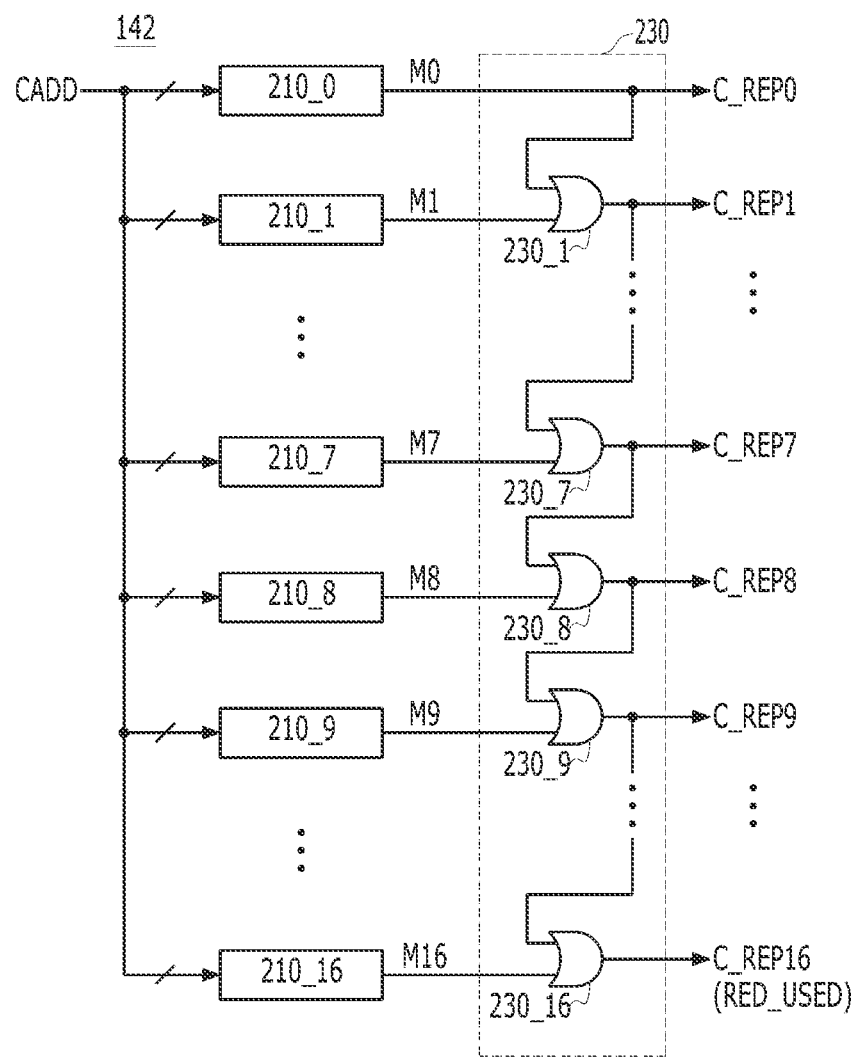
FIG. 3 is a circuit diagram illustrating a repair information storage circuit of FIG. 1 according to an embodiment of the present invention.

FIG. 3 is a circuit diagram illustrating the repair information storage circuit 142 of FIG. 1 according to an embodiment of the present invention.

Referring to FIG. 3, the repair information storage circuit 142 may include first to 17-th address storage circuits 210_0 to 210_16, and a signal generation circuit 230.

The first to 17-th address storage circuits 210_0 to 210_16 may respectively correspond to the first to eighth normal cell blocks MB0 to MB7, the ECC cell block MBECC, and the ninth to 16-th normal cell blocks MB8 to MB15. Each of the first to 17-th address storage circuits 210_0 to 210_16 may store at least one defective address of a corresponding cell block. The first to 17-th address storage circuits 210_0 to 210_16 may generate first to 17-th match signals M0 to M16 by comparing the column address CADD with the stored defective address, respectively. The first to 17-th address storage circuits 210_0 to 210_16 may activate a corresponding match signal to a logic high level when the column address CADD matches the stored defective address.

The signal generator 230 may generate the first to 17-th block repair signals C_REP0 to C_REP16 corresponding to the first to 17-th match signals M0 to M16. The signal generator 230 activates the first to 17-th block repair signals C_REP0 to C_REP16 to a logic high level when the first match signal M0 is activated, the signal generator 230 activates the second to 17-th block repair signals C_REP1 to C_REP16 to a logic high level when the second match signal M1 is activated, and in this way, the signal generator 230 activates the k-th to 17-th block repair signals C_REP(k-1) to C_REP16 to a logic high level when the k-th match signal M(k-1) is activated.

In detail, the signal generation circuit 230 may include first to 16-th OR gates 230_1 to 230_16. The signal generator 230 may output the first match signal M0 as the first block repair signal C_REP0, and the first OR gate 2301 may perform a logic OR operation on the second match signal M1 and the first block repair signal C_REP0 to output the second block repair signal C_REP1. The seventh OR gate 230_7 may perform a logic OR operation on the eighth match signal M7 and the seventh block repair signal C_REP6 to output the eighth block repair signal C_REP7. That is, the first to 16-th OR gates 230_1 to 230_16 may perform a logic OR operation on a corresponding match signal and a block repair signal at a previous stage to output a corresponding block repair signal.

In addition, when any of the first to 17-th match signals M0 to M16 is activated, the signal generation circuit 230 may activate the repair use signal RED_USED to inform that the redundancy cell block MBRED has been used for the repair operation. For example, the signal generation circuit 230 may output the 17-th block repair signal C_REP16 as the repair use signal RED_USED.

Figure 4:
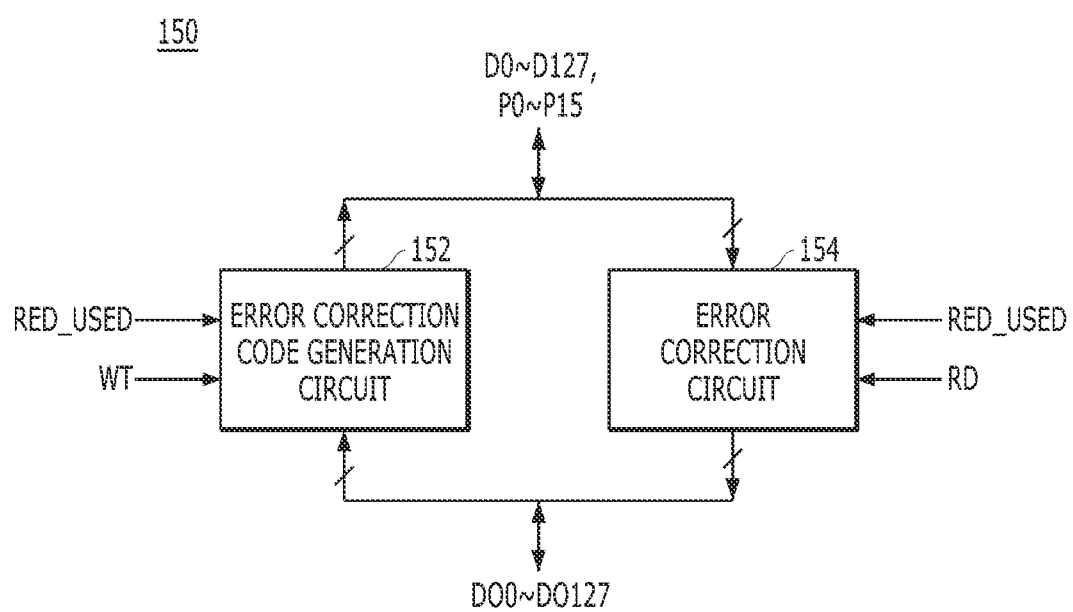
FIG. 4 is a block diagram illustrating an error correction deice of FIG. 1 according to an embodiment of the present invention.

FIG. 4 is a block diagram illustrating the error correction deice 150 of FIG. 1 according to an embodiment of the present invention.

Referring to FIG. 4, the error correction device 150 may include an error correction code generation circuit 152 and an error correction circuit 124.

The error correction code generation circuit 152 may generate the first error correction codes P0 to P7 of 8-bit, or the first and second error correction codes P0 to P8 and P9 to P15 of 16-bit using the 128-bit data DO0 to DO127 according to the repair use signal RED_USED, during a write operation in which the write command WT is input. Since the error correction codes P0 to P15 are generated by the error correction code generation circuit 152 without performing an error correction operation during the write operation, the data DO0 to DO127 input to the error correction code generation circuit 152 are the same as the data D0 to D127 output from the error correction code generation circuit 152. A detailed configuration of the error correction code generation circuit 152 will be described in detail with reference to FIG. 6.

The error correction circuit 154 may correct errors in the data D0 to D127 using the first error correction codes P0 to P7 of 8-bit, or the first and second error correction codes P0 to P7 and P8 to P15 of 16-bit, according to the repair use signal RED_USED, during a read operation in which the read command RD is input. Here, correcting the error may mean detecting the error of the data D0 to D127 using the first and/or second error correction codes P0 to P7 and P8 to P15 and correcting the error when the error is detected. The data DO0 to DO127 in which the error is corrected by the error correction circuit 154 may be output to the outside through the data pads DQ0 to DQ7 by the data I/O circuit 160. A detailed configuration of the error correction circuit 154 will be described in detail with reference to FIGS. 7 and 8.

The error correction code generation circuit 152 or the error correction circuit 154 may generate the error correction codes using a check matrix, also called an H matrix, which will be described below.

FIGS. 5A to 5D are diagrams illustrating a check matrix used in the error correction code generation circuit 152 and the error correction circuit 154 of FIG. 4 according to an embodiment of the present invention. Here, for the sake of convenience in description, 8-bit data D0 to D7 and 4-bit error correction codes E0 to E3 are used.

Referring to FIG. 5A, the check matrix may be formed of a matrix of (the number of bits of the error correction codes)×(the number of bits of the error correction codes+the number of bits of the data). Here, since the error correction codes are formed of 4 bits and the data is formed of 8 bits, the check matrix may be a 4×12 matrix. Each component of the check matrix may have a value of 1 or 0.

Column vectors of the check matrix may respectively correspond to the bits of the data D0 to D7 and the bits of the error correction codes E0 to E3. For example, among 12 column vectors, 8 column vectors may correspond to the bits of the data D0 to D7, and 4 column vectors may correspond to the bits of the error correction codes E0 to E3. In FIG. 5A, it may be seen that 'D1' corresponds to a column vector having a value of '1101', and 'E2' corresponds to a column vector having a value of '0010'.

Referring to FIG. 5B, how the error correction code generation circuit 152 or the error correction circuit 154 uses the check matrix, is shown. The error correction code generation circuit 152 or the error correction circuit 154 may generate the error correction codes E0 to E3 in such a manner that each of the column vectors of the check matrix is multiplied by corresponding bits of the data and the error correction codes and then the sum of each row becomes 0 (which is an even number). That is, the error correction codes E0 to E3 may be generated to satisfy all four equations shown in FIG. 5B.

Referring to FIG. 5C, a result of the error correction code generation circuit 152 generating the error correction codes E0 to E3 (0,1,1,0) for the data D0 to D7 (1,1,0,0,1,0,1,0) by using the check matrix of FIG. 5A, is shown. When the data D0 to D7 (1,1,0,0,1,0,1,0) and the error correction codes E0 to E3 (0,1,1,0) are put into the above four equations, it may be seen that the sum of each of the rows is 0 (i.e., an even number) and the four equations are satisfied, as described in FIG. 5C.

In the process of correcting errors in the data D0 to D7 and the error correction codes E0-E3 by the error correction circuit 154 using the error correction codes E0-E3, the four equations in FIG. 5B may also be used. If the sum of each of the rows calculated by the four equations is 0 (i.e., even number), it may indicate that there is no error, and if not, it may indicate that there is an error at the position indicated by the result.

Referring to FIG. 5D, a process of the error correction circuit 120 correcting errors based on the error correction codes, is shown. In FIG. 5D it is shown that an error occurs in which the bit D6 is changed from 1 to 0 (1→0) among the data D0 to D7 (1,1,0,0,1,0,1,0) so that the data D0 to D7 becomes (1,1,0,0, 1,0,0,0).

The results shown in FIG. 5D are obtained by calculating four equations by putting the data D0 to D7 (1,1,0,0,1,0,0,0) and the error correction codes E0 to E3 (0,1,1,0) into the check matrix. The result "1,0,0,1" indicates the position of the error. Since the column vector having a value of "1,0,0,1" among the column vectors of the check matrix is a column vector corresponding to the bit D6, the error correction circuit 154 may determine that the bit D6 has an error and invert the bit D6 to 0→1 to correct the error. That is, the error may be corrected correctly.

Figure 6:
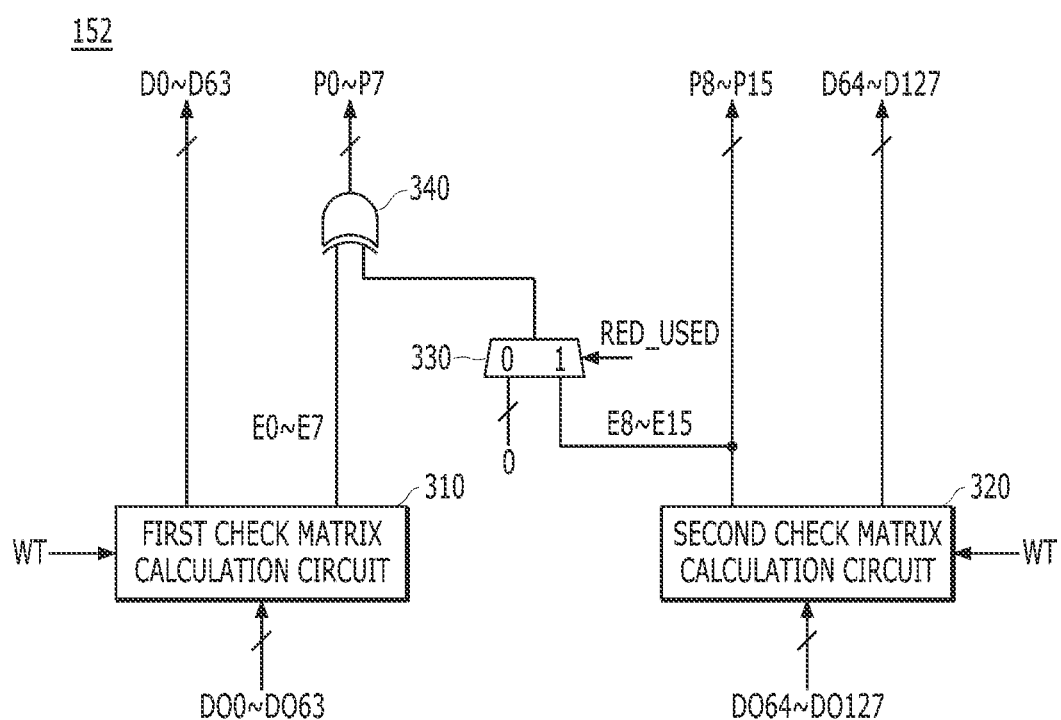
FIG. 6 is a detailed block diagram of an error correction code generation circuit of FIG. 4 according to an embodiment of the present invention.

FIG. 6 is a detailed block diagram of the error correction code generation circuit 152 of FIG. 4 according to an embodiment of the present invention.

Referring to FIG. 6, the error correction code generation circuit 152 may include a first check matrix calculation circuit 310, a second check matrix calculation circuit 320, an encoding selector 330, and a logic gate 340.

The first check matrix calculation circuit 310 may receive 64-bit lower data DO0 to DO63 among the 128-bit data DO0 to DO127 provided from the data I/O circuit 160 in response to a write command WT. The first check matrix calculation circuit 310 may generate first preliminary error correction codes E0 to E7 of 8-bit using the 64-bit lower data DO0 to DO63. In this case, the lower data DO0 to DO63, which are input to the first check matrix calculation circuit 310, and the lower data D0 to D63 which are output from the first check matrix calculation circuit 310 may be the same.

The second check matrix calculation circuit 320 may receive 64-bit upper data DO64 to DO127 among the 128-bit data DO0 to DO127 provided from the data I/O circuit 160 in response to the write command WT. The second check matrix calculation circuit 320 may generate second preliminary error correction codes E8 to E15 of 8-bit using the 64-bit upper data DO64 to DO127. The second preliminary error correction codes E8 to E15 may be provided as the second error correction codes P8 to P15. In this case, the upper data DO64 to DO127 input to the second check matrix calculation circuit 320 and the upper data D64 to D127 output from the second check matrix calculation circuit 320 may be the same.

The first check matrix calculation circuit 310 and the second check matrix calculation circuit 320 may generate the first and second error correction codes P0 to P7 and P8 to P15 using the check matrix described in FIGS. 5A to 5D. However, this invention is not limited to this, and the first check matrix calculation circuit 310 and the second check matrix calculation circuit 320 may generate error correction codes by applying known BCH codes, hamming codes, or RS codes or other types of parity codes.

The encoding selector 330 may select one of all-zero codes "00000000" (i.e., 0) and the second preliminary error correction codes E8 to E15 according to the repair use signal RED_USED. The encoding selector 330 may select the second preliminary error correction codes E8 to E15 when the repair use signal RED_USED is activated to a logic high level, and may select the all-zero codes "00000000" when the repair use signal RED_USED is deactivated to a logic low level.

The logic gate 340 may perform a logic exclusive OR (XOR) operation on the first preliminary error correction codes E0 to E7 and the selected code from the encoding selector 330 to output the first error correction codes P0 to P7.

With the above configuration, the error correction code generation circuit 152 may generate the first error correction codes P0 to P7 of 8-bit using the 128-bit data DO0 to DO127 when the repair use signal RED_USED is activated to a logic high level during a write operation. On the other hand, when the repair use signal RED_USED is deactivated to the logic low level during a write operation, the error correction code generation circuit 152 may generate the first error correction codes P0 to P7 of 8-bit using the 64-bit lower data D00 to D063, and the second error correction codes P8 to P15 of 8-bit using the 64-bit upper data D064 to D0127.

Figure 7:
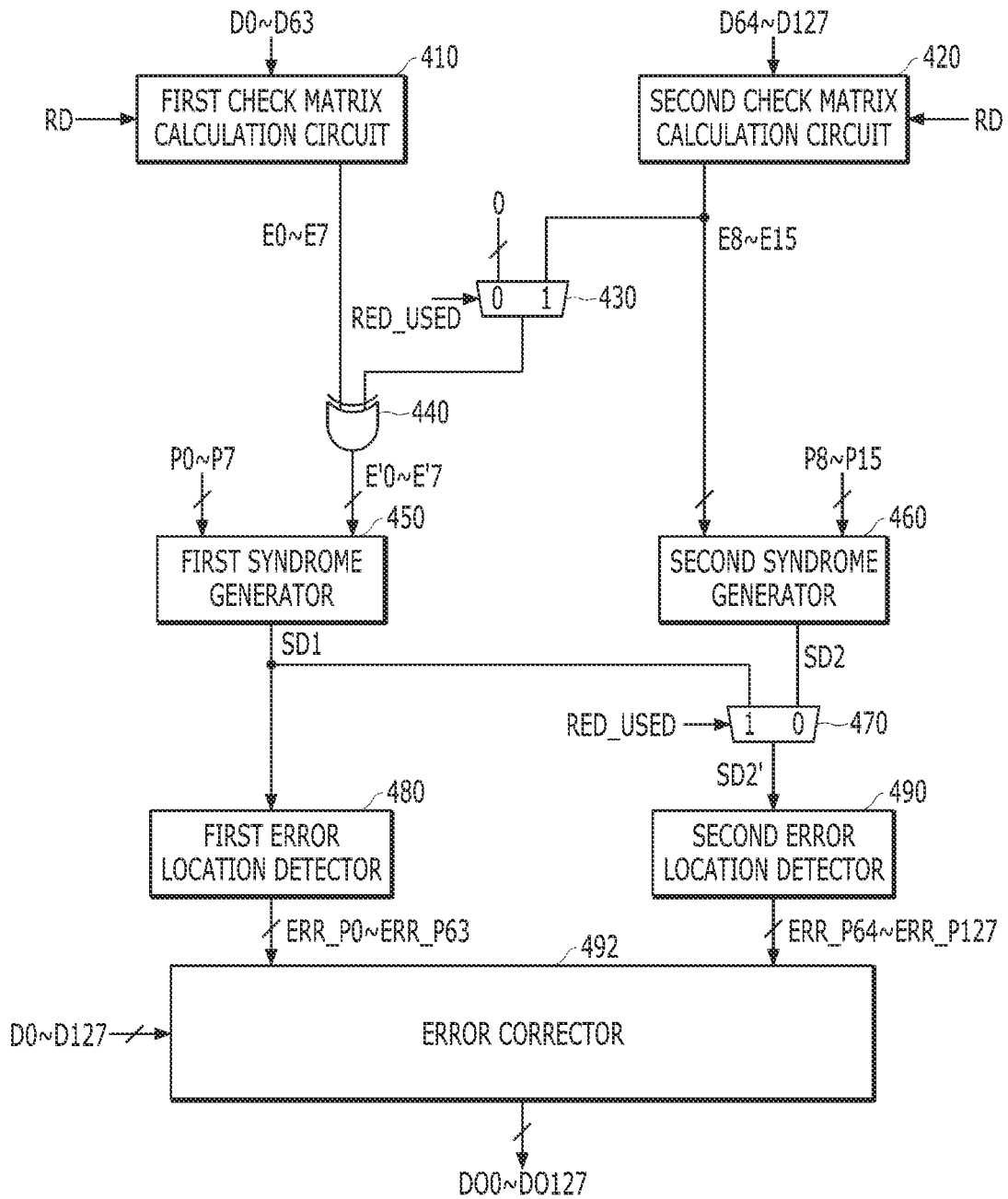
FIG. 7 is a detailed block diagram of an error correction circuit of FIG. 4 according to an embodiment of the present invention.
Figure 8:
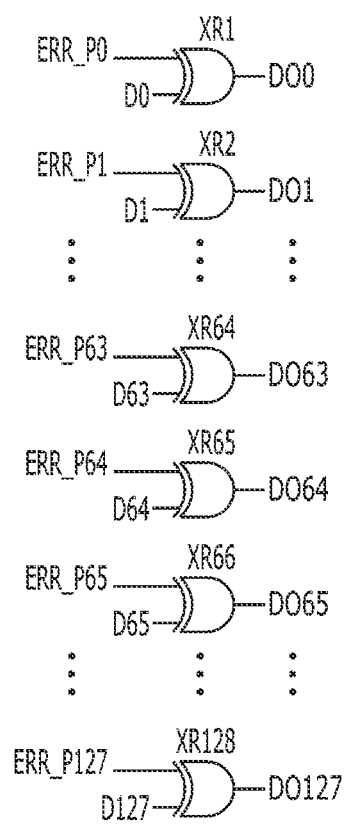
FIG. 8 is a circuit diagram of an error corrector of FIG. 7 according to an embodiment of the present invention.

FIG. 7 is a detailed block diagram of the error correction circuit 154 of FIG. 4 according to an embodiment of the present invention. FIG. 8 is a circuit diagram of an error corrector 492 of FIG. 7 according to an embodiment of the present invention.

Referring to FIG. 7, the error correction circuit 154 may include a first check matrix calculation circuit 410, a second check matrix calculation circuit 420, a first decoding selector 430, a logic gate 440, a first syndrome generator 450, a second syndrome generator 460, a second decoding selector 470, a first error location detector 480, a second error location detector 490, and an error corrector 492.

The first check matrix calculation circuit 410 may receive the 64-bit lower data D0 to D63 among the 128-bit data D0 to D127 provided from the memory cell array 110 in response to a read command RD. The first check matrix calculation circuit 410 may generate first preliminary error correction codes E0 to E7 of 8-bit using the 64-bit lower data D0 to D63.

The second check matrix calculation circuit 420 may receive the 64-bit upper data D64 to D127 among the 128-bit data D0 to D127 provided from the memory cell array 110 in response to the read command RD. The second check matrix calculation circuit 420 may generate second preliminary error correction codes E8 to E15 of 8-bit using the 64-bit upper data D64 to D127.

For reference, the first and second check matrix calculation circuits 410 and 420 included in the error correction circuit 154 of FIG. 7 may have substantially the same configuration as the first and second check matrix calculation circuits 310 and 320 included in the error correction code generation circuit 152 of FIG. 6. Depending on the embodiment, the first check matrix calculation circuit 410 of the error correction circuit 154 and the first check matrix calculation circuit 310 of the error correction circuit 152 may be merged into one configuration, and the second check matrix calculation circuit 420 of the error correction circuit 154 and the second check matrix calculation circuit 320 of the error correction circuit 152 may be merged into one configuration.

The first decoding selector 430 may select one of all-zero codes "00000000" (i.e., 0) and the second preliminary error correction codes E8 to E15 according to the repair use signal RED_USED. The first decoding selector 430 may select the second preliminary error correction codes E8 to E15 when the repair use signal RED_USED is activated to a logic high level, and the all-zero codes "00000000" when the repair use signal RED_USED is deactivated to a logic low level.

The logic gate 440 may perform a logic exclusive OR (XOR) operation on the first preliminary error correction codes E0 to E7 and the selected code from the first decoding selector 430 to output third preliminary error correction codes E'0 to E'7.

The first syndrome generator 450 may generate first syndrome data SD1 as encoding information on an error location by comparing, on a bit-by-bit basis, the first error correction codes P0 to P7 provided from the memory cell array 110, with the third preliminary error correction codes E'0 to E'7.

The second syndrome generator 460 may generate second syndrome data SD2 as encoding information on an error location information by comparing the second error correction codes P8 to P15 provided from the memory cell array 110, with the second preliminary error correction codes E8 to E15.

The second decoding selector 470 may select one of the first syndrome data SD1 and the second syndrome data SD2 according to the repair use signal RED_USED to output third syndrome data SD2'.

The second decoding selector 470 may select the first syndrome data SD1 when the repair use signal RED_USED is activated to a logic high level, and select the second syndrome data SD2 when the repair use signal RED_USED is deactivated to a logic low level.

The first error location detector 480 may detect error positions of the lower data D0 to D63 based on the first syndrome data SD1. The first error location detector 480 may decode the first syndrome data SD1 to generate 64-bit first error flags ERR_P0 to ERR_P63 indicating error location information of the lower data D0 to D63. The first error flags ERR_P0 to ERR_P63 may indicate which bits of the lower data D0 to D63 have errors.

The second error location detector 490 may detect error positions of the upper data D64 to D127 based on the third syndrome data SD2'. The second error location detector 490 may decode the third syndrome data SD2' to generate 64-bit second error flags ERR_P64 to ERR_P127 indicating error location information of the upper data D64 to D127. The second error flags ERR_P64 to ERR_P127 may indicate which bits of the upper data D64 to D127 have errors.

The error corrector 492 may correct errors in the lower data D0 to D63 based on the first error flags ERR_P0 to ERR_P63, and correct errors in the upper data D64 to D127 based on the second error flags ERR_P64 to ERR_P127 to output error corrected data DO0 to D127.

Referring to FIG. 8, the error corrector 492 may include first to 128th XOR gates XR1 to XR128. The first to 64th XOR gates XR1 to XR64 may output the error corrected data DO0 to DO63 by performing a logic XOR operation on each of the first error flags ERR_P0 to ERR_P63 with each bit of the lower data D0 to D63. The 65th to 128th XOR gates XR65 to XR128 may output the error corrected data DO64 to DO127 by performing a logic XOR operation on each of the second error flags ERR_P64 to ERR_P127 with each bit of the upper data D64 to D127. With the above configuration, the error corrector 492 may output the error corrected data DO0 to DO127 by outputting bits at locations where errors do not occur as they are, and inverting and outputting bits at locations where errors occur.

With the above configuration, when the repair use signal RED_USED is activated to a logic high level during a read operation, the error correction circuit 154 may correct the error of the 128-bit data D0 to D127 using the first error correction codes P0 to P7 of 8-bit. On the other hand, when the repair use signal RED_USED is deactivated to a logic low level during the read operation, the error correction circuit 154 may correct the error of the 64-bit lower data D0 to D63 using the first error correction codes P0 to P7 of 8-bit, and correct the 64-bit upper data D64 to D127 using the second error correction codes P8 to P15 of 8-bit.

Hereinafter, an operation of the memory device 100 according to an embodiment of the present invention will be described with reference to the drawings.

Figure 9A:
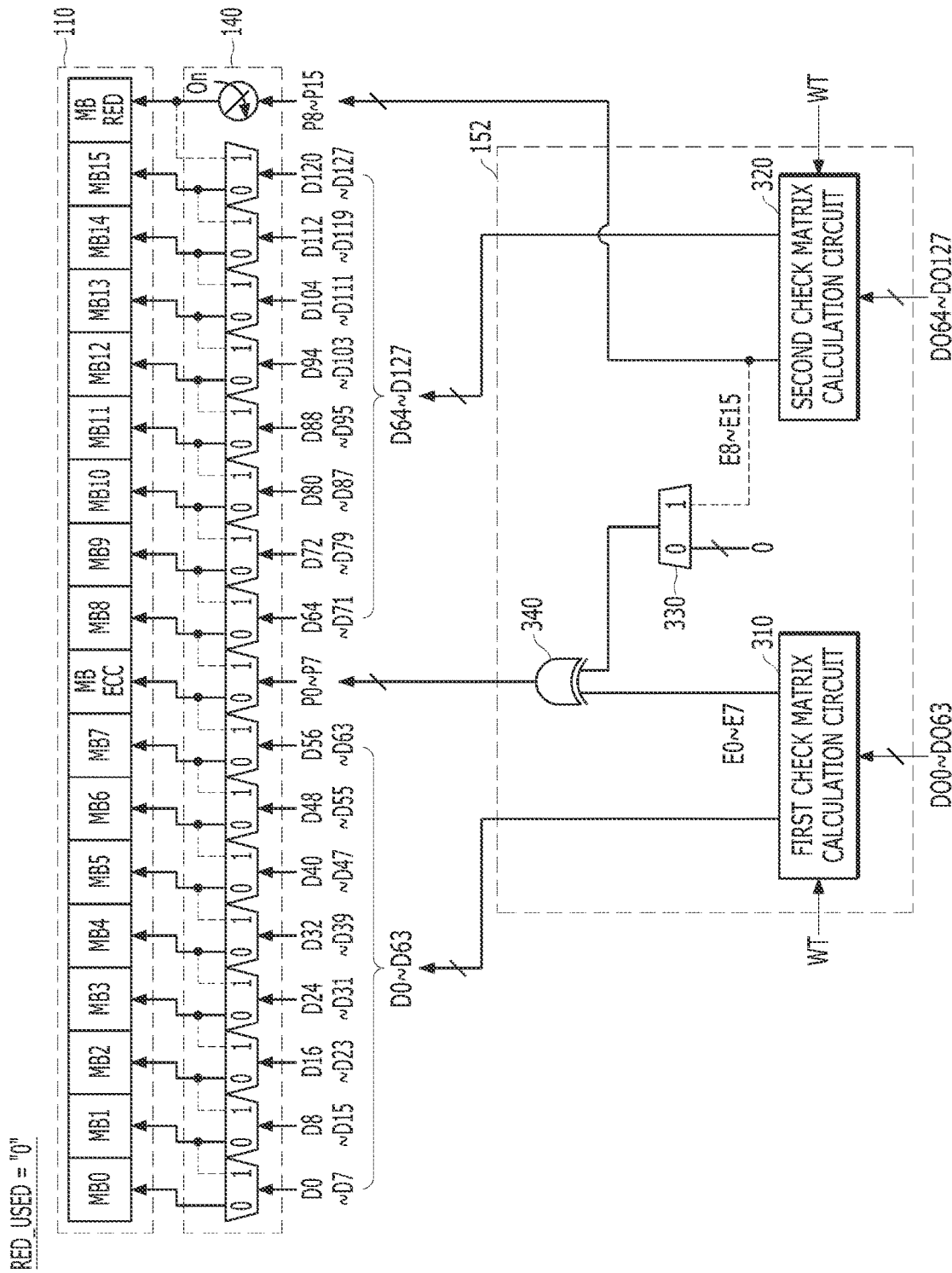
FIGS. 9A and 9B are diagrams illustrating an operation of a memory device according to an embodiment of the present invention.
Figure 9B:
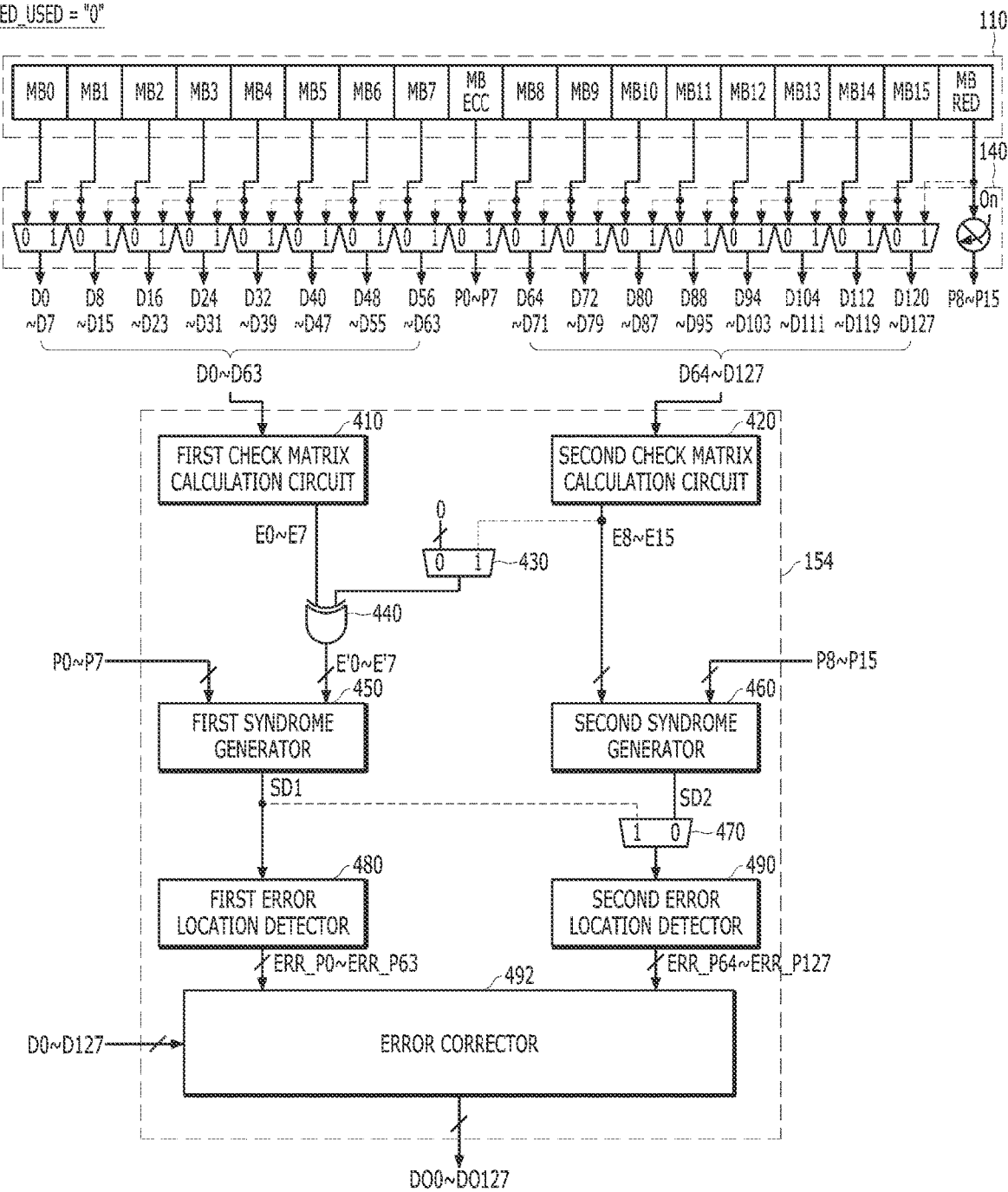

FIGS. 9A and 9B are diagrams illustrating a write operation and a read operation of a memory device according to an embodiment of the present invention, when the repair use signal RED_USED is deactivated.

Referring to FIG. 9A, since the redundancy cell block MBRED is not used for a repair operation, the repair use signal RED_USED is deactivated to a logic low level. In this case, the first to 17-th block repair signals C_REP0 to C_REP16 may also be deactivated to a logic low level.

The first check matrix calculation circuit 310 of the error correction code generation circuit 152 may generate the first preliminary error correction codes E0 to E7 of 8-bit using the 64-bit lower data DO0 to DO127 provided from the data I/O circuit 160 in response to the write command WT. The second check matrix calculation circuit 320 may generate the second preliminary error correction codes E8 to E15 of 8-bit using the 64-bit upper data DO64 to DO127 provided from the data I/O circuit 160. According to the repair use signal RED_USED of the logic low level, the encoding selector 330 may select the all-zero codes "00000000", and the logic gate 340 may output the first preliminary error correction codes E0 to E7 as it is as the first error correction codes P0 to P7. The second preliminary error correction codes E8 to E15 may be provided as the second error correction codes P8 to P15.

As a result, the error correction code generation circuit 152 may generate the 8-bit first error correction codes P0 to P7 using the 64-bit low data DO0 to DO63, and generate the 8-bit second error correction codes P0 to P127 using the 64-bit upper data DO64 to DO127, during the write operation. At this time, the lower data DO0 to DO63 input to the first check matrix calculation circuit 310 and the lower data D0 to D63 output from the first check matrix calculation circuit 310 may be the same, and the upper data DO64 to DO127 input to the second check matrix calculation circuit 320 and the upper data D64 to D127 output from the second check matrix calculation circuit 320 may be the same.

The first to eighth path selectors 1401 to 1408 of the repair control circuit 140 may transfer the 64-bit lower-data D0 to D63 to the first to eighth normal cell blocks MB0 to MB7 in response to the first to eighth block repair signals C_REP0 to C_REP7 of the logic low level. The ninth path selector 1409 may transfer the 8-bit first error correction codes P0 to P7 to the ECC cell block MBECC in response to the ninth block repair signal C_REP8 of the logic low level. The tenth to 17-th path selectors 1410 to 1417 may transfer the 64-bit upper data D64 to D127 to the ninth to 16-th normal cell blocks MB8 to MB15 in response to the tenth to 17-th block repair signals C_REP9 to C_REP16 of the logic low level. The path blocking switch 1418 may be turned on to transfer the second error correction codes P8 to P15 to the redundancy cell block MBRED, in response to the repair use signal RED_USED of the logic low level.

Referring to FIG. 9B, the first to eighth path selectors 1401 to 1408 of the repair control circuit 140 may transfer the 64-bit lower-data D0 to D63 from the first to eighth normal cell blocks MB0 to MB7 to the error correction circuit 154, in response to the first to eighth block repair signals C_REP0 to C_REP7 of the logic low level. The ninth path selector 1409 may transfer the 8-bit first error correction codes P0 to P7 provided from the ECC cell block MBECC to the error correction circuit 154 in response to the ninth block repair signal C_REP8 of the logic low level. The tenth to 17-th path selectors 1410 to 1417 may transfer the 64-bit upper data D64 to D127 provided from the ninth to 16-th normal cell blocks MB8 to MB15 to the error correction circuit 154 in response to the tenth to 17-th block repair signals C_REP9 to C_REP16 of the logic low level. The path blocking switch 1418 may be turned on to transfer the second error correction codes P8 to P15 provided from the redundancy cell block MBRED to the error correction circuit 154, in response to the repair use signal RED_USED of the logic low level.

The first check matrix calculation circuit 410 of the error correction circuit 154 may generate the 8-bit first preliminary error correction codes E0 to E7 using the 64-bit lower data D0 to D63 in response to the read command RD. The second check matrix calculation circuit 420 may generate the 8-bit second preliminary error correction codes E8 to E15 using the 64-bit upper data D64 to D127 in response to the read command RD. According to the repair use signal RED_USED of the logic low level, the first decoding selector 430 may select the all-zero codes "00000000", and the logic gate 440 may output the first preliminary error correction codes E0 to E7 as the third preliminary error correction codes E'0 to E'7. The first syndrome generator 450 may generate the first syndrome data SD1 by comparing the first error correction codes P0 to P7 with the third preliminary error correction codes E'0 to E7 (i.e., the first preliminary error correction codes E0 to E7), and the second syndrome generator 460 may generate the second syndrome data SD2 by comparing the second error correction codes P8 to P15 with the second preliminary error correction codes E8 to E15.

The second decoding selector 470 may select the second syndrome data SD2. The first error location detector 480 may detect the error location of the lower data D0 to D63 based on the first syndrome data SD1, and the second error location detector 490 may detect the error location of the upper data D64 to D127 based on the second syndrome data SD2. The error corrector 492 may correct the error of the lower data D0 to D63 based on the first error flags ERR_P0 to ERR_P63, and correct the error of the upper data D64 to D127 based on the second error flags ERR_P64 to ERR_P127 to output the error corrected data DO0 to D127.

As described above, in an embodiment of the present invention, when the redundancy cell block MBRED is not used for the repair operations, the errors of the 128-bit data may be corrected using the 16-bit error correction codes by using the redundancy cell block MBRED to store the additional error correction codes. Accordingly, the error correction capability may be maximized without increasing the additional area.

Figure 10A:
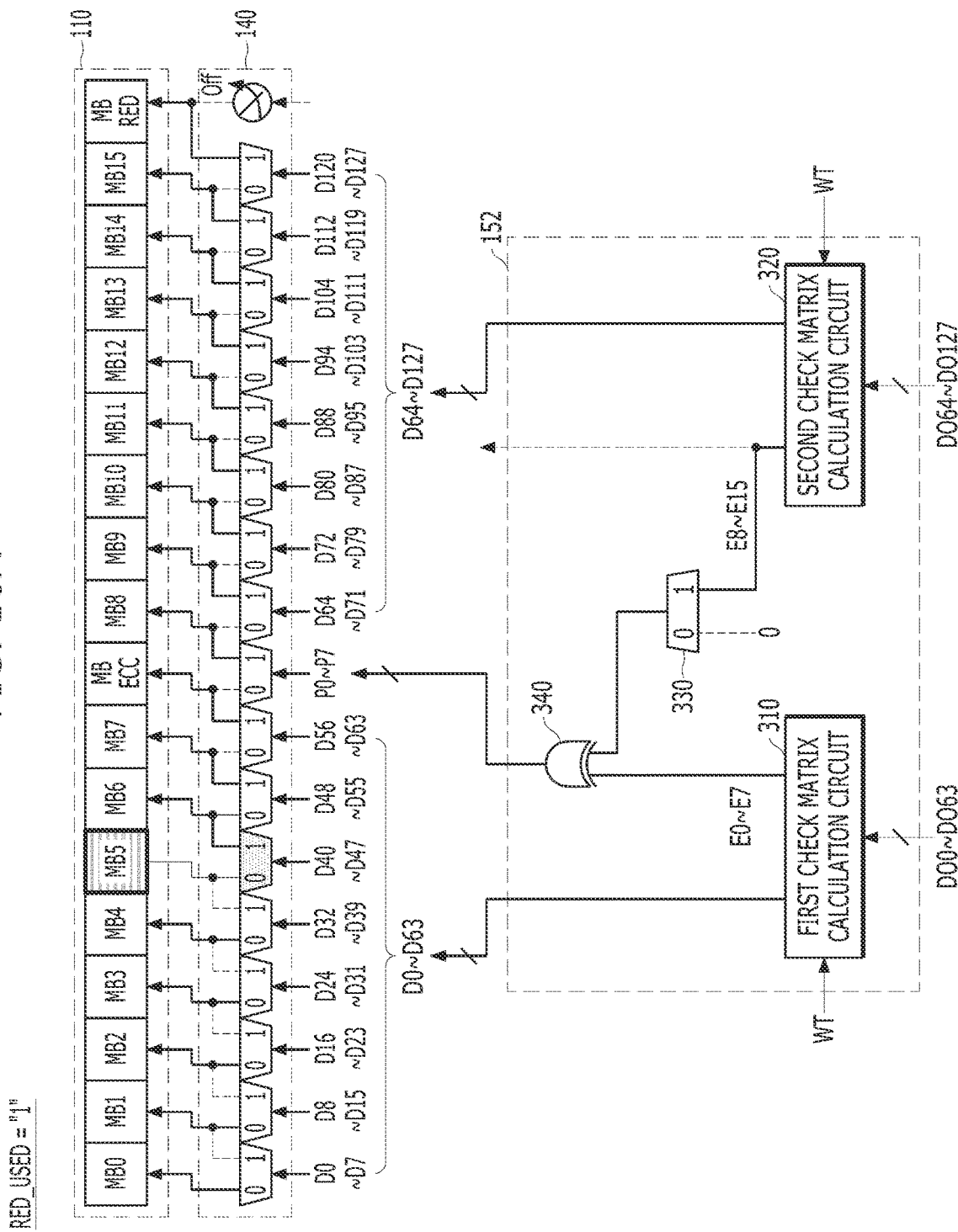
FIGS. 10A and 10B are diagrams for describing an operation of a memory device according to an embodiment of the present invention.
Figure 10B:
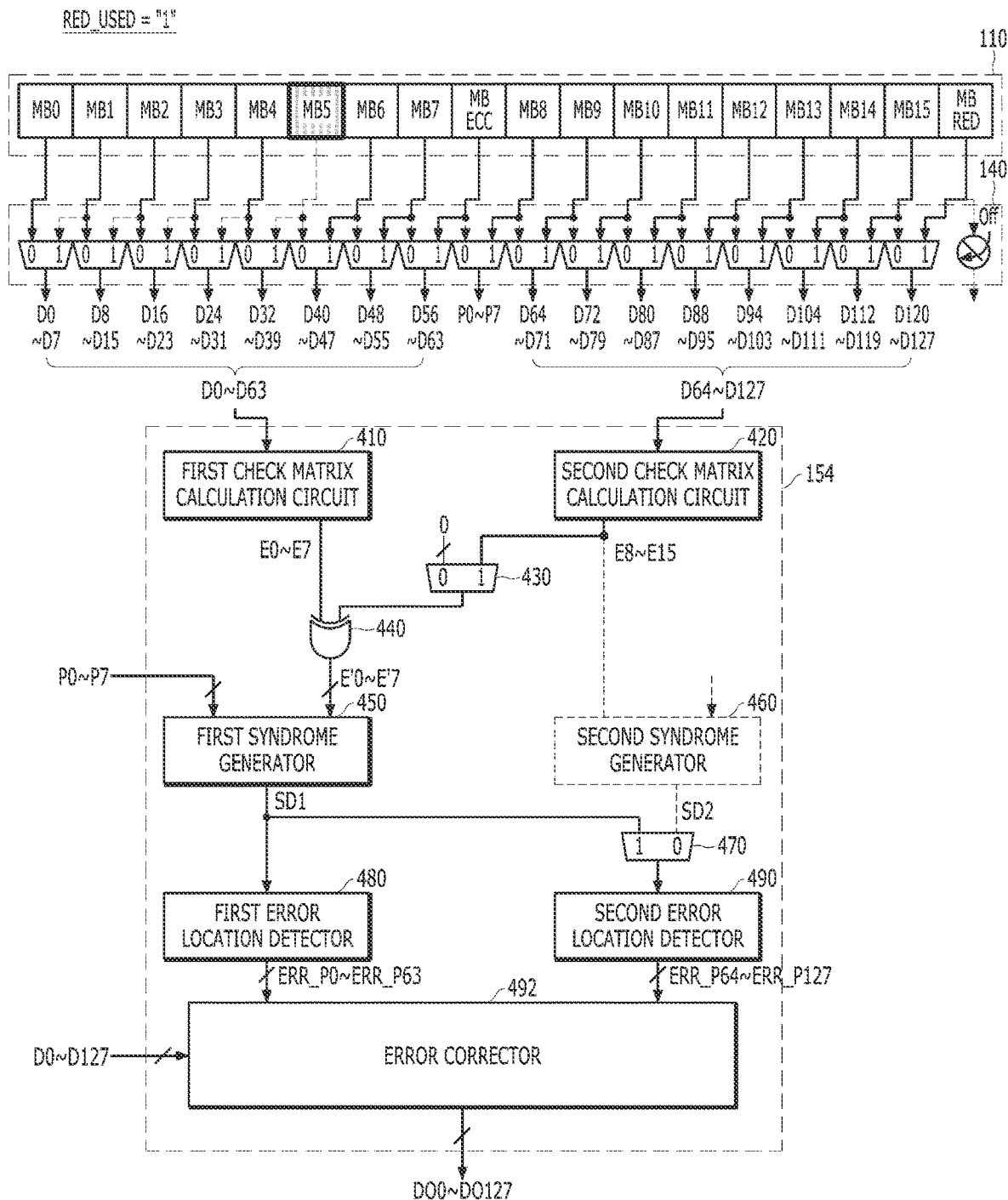

FIGS. 10A and 10B are diagrams for describing a write operation and a read operation of a memory device according to an embodiment of the present invention, when the repair use signal RED_USED is activated.

Referring to FIG. 10A, since the redundancy cell block MBRED is used for a repair operation, the repair use signal RED_USED is activated to the logic high level. When a defective bit line exists in the sixth normal cell block MB5, the first to fifth block repair signals C_REP0 to C_REP4 are deactivated to the logic low level, while all of the sixth to 17-th block repair signals C_REP5 to C_REP16 are activated to the logic high level.

The first check matrix calculation circuit 310 of the error correction code generation circuit 152 may generate the first preliminary error correction codes E0 to E7 of 8-bit using the 64-bit lower data DO0 to DO127 provided from the data I/O circuit 160 in response to the write command WT. The second check matrix calculation circuit 320 may generate the second preliminary error correction codes E8 to E15 of 8-bit using the 64-bit upper data DO64 to DO127 provided from the data I/O circuit 160. According to the repair use signal RED_USED of the logic high level, the encoding selector 330 may select the second preliminary error correction codes E8 to E15, and the logic gate 340 may output the first preliminary error correction codes E0 to E7 by perform a logic XOR operation on the first preliminary error correction codes E0 to E7 and the second preliminary error correction codes E8 to E15.

As a result, the error correction code generation circuit 152 may generate the 8-bit first error correction codes P0 to P7 using the 128-bit data DO0 to DO127.

The first to fifth path selectors 1401 to 1405 of the repair control circuit 140 may transfer the 40-bit lower-data D0 to D39 to the first to fifth normal cell blocks MB0 to MB4 in response to the first to fifth block repair signals C_REP0 to C_REP4 of the logic low level. The sixth to eighth path selectors 1406 to 1408 may transfer the 24-bit lower-data D40 to D63 to the seventh and eighth normal cell blocks MB6 and MB7 and the ECC cell block MBECC in response to the sixth to eighth block repair signals C_REP5 to C_REP7 of the logic high level.

The ninth path selector 1409 may transfer the 8-bit first error correction codes P0 to P7 to the ninth normal cell block MB8 in response to the ninth block repair signal C_REP8 of the logic high level. Accordingly, the first error correction codes P0 to P7 may be written to the ninth normal cell blocks MB8 instead of the ECC cell block MBECC. That is, when the redundancy cell block MBRED is used for the repair operation for one of the first to eighth normal cell blocks MB0 to MBECC, the first error correction codes P0 to P7 may be stored in an adjacent cell block (i.e., the ninth normal cell block MB8) to the ECC cell block.

The tenth to 17-th path selectors 1410 to 1417 may transfer the 64-bit upper data D64 to D127 to the tenth to 16-th normal cell blocks MB9 to MB15, and the redundancy cell block MBRED in response to the tenth to 17-th block repair signals C_REP9 to C_REP16 of the logic high level. The path blocking switch 1418 may be turned off to block a transmission path of the second error correction codes P8 to P15 in response to the repair use signal RED_USED of the logic high level.

Referring to FIG. 10B, the first to fifth path selectors 1401 to 1405 of the repair control circuit 140 may transfer the 40-bit lower data D0 to D39 provided from the first to fifth normal cell blocks MB0 to MB4 to the error correction circuit 154, in response to the first to fifth block repair signals C_REP0 to C_REP4 of the logic low level. The sixth to eighth path selectors 1406 to 1408 may transfer the 24-bit lower-data D40 to D63 from the seventh and eighth normal cell blocks MB6 and MB7 and the ECC cell block MBECC to the error correction circuit 154, in response to the sixth to eighth block repair signals C_REP5 to C_REP7 of the logic high level.

The ninth path selector 1409 may transfer the 8-bit first error correction codes P0 to P7 from the ninth normal cell block MB8 to the error correction circuit 154 in response to the ninth block repair signal C_REP8 of the logic high level. The tenth to 17-th path selectors 1410 to 1417 may transfer the 64-bit upper data D64 to D127 from the tenth to 16-th normal cell blocks MB9 to MB15 and the redundancy cell block MBRED to the error correction circuit 154 in response to the tenth to 17-th block repair signals C_REP9 to C_REP16 of the logic high level. The path blocking switch 1418 may be turned off to block a transmission path of the second error correction codes P8 to P15 in response to the repair use signal RED_USED of the logic high level.

The first check matrix calculation circuit 410 of the error correction circuit 154 may generate the 8-bit first preliminary error correction codes E0 to E7 using the 64-bit lower data D0 to D63 in response to the read command RD. The second check matrix calculation circuit 420 may generate the 8-bit second preliminary error correction codes E8 to E15 using the 64-bit upper data D64 to D127 in response to the read command RD. According to the repair use signal RED_USED of the logic high level, the first decoding selector 430 may select the second preliminary error correction codes E8 to E15, and the logic gate 440 may output the third preliminary error correction codes E'0 to E'7 by performing a logic XOR operation on the first preliminary error correction codes E0 to E7 and the second preliminary error correction codes E8 to E15.

The first syndrome generator 450 may compare the first error correction codes P0 to P7 with the third preliminary error correction code E'0 to E'7 to generate the first syndrome data SD1, and the second decoding selector 470 may select the first syndrome data SD1. The first error location detector 480 and the second error location detector 490 may respectively detect the error locations of the lower data D0 to D63 and the upper data D64 to D127 based on the first syndrome data SD1. The error corrector 492 may correct the error of the lower data D0 to D63 based on the first error flags ERR_P0 to ERR_P63, and correct the error of the upper data D64 to D127 based on the second error flags ERR_P64 to ERR_P127 to output the error corrected data DO0 to D127.

As described above, when the redundancy cell block MBRED is used for the repair operation, the error correction circuit 154 may correct the errors of the 128-bit data using the 8-bit error correction codes.

In the above embodiment, a case where the first to eighth normal cell blocks MB0 to MB7, the ECC cell blocks MBECC, the ninth to 16-th normal cell blocks MB8 to MB15 are sequentially disposed in the row direction has been described. However, the proposed invention is not limited thereto, and a plurality of cell blocks may be disposed in various forms.

Figure 11:
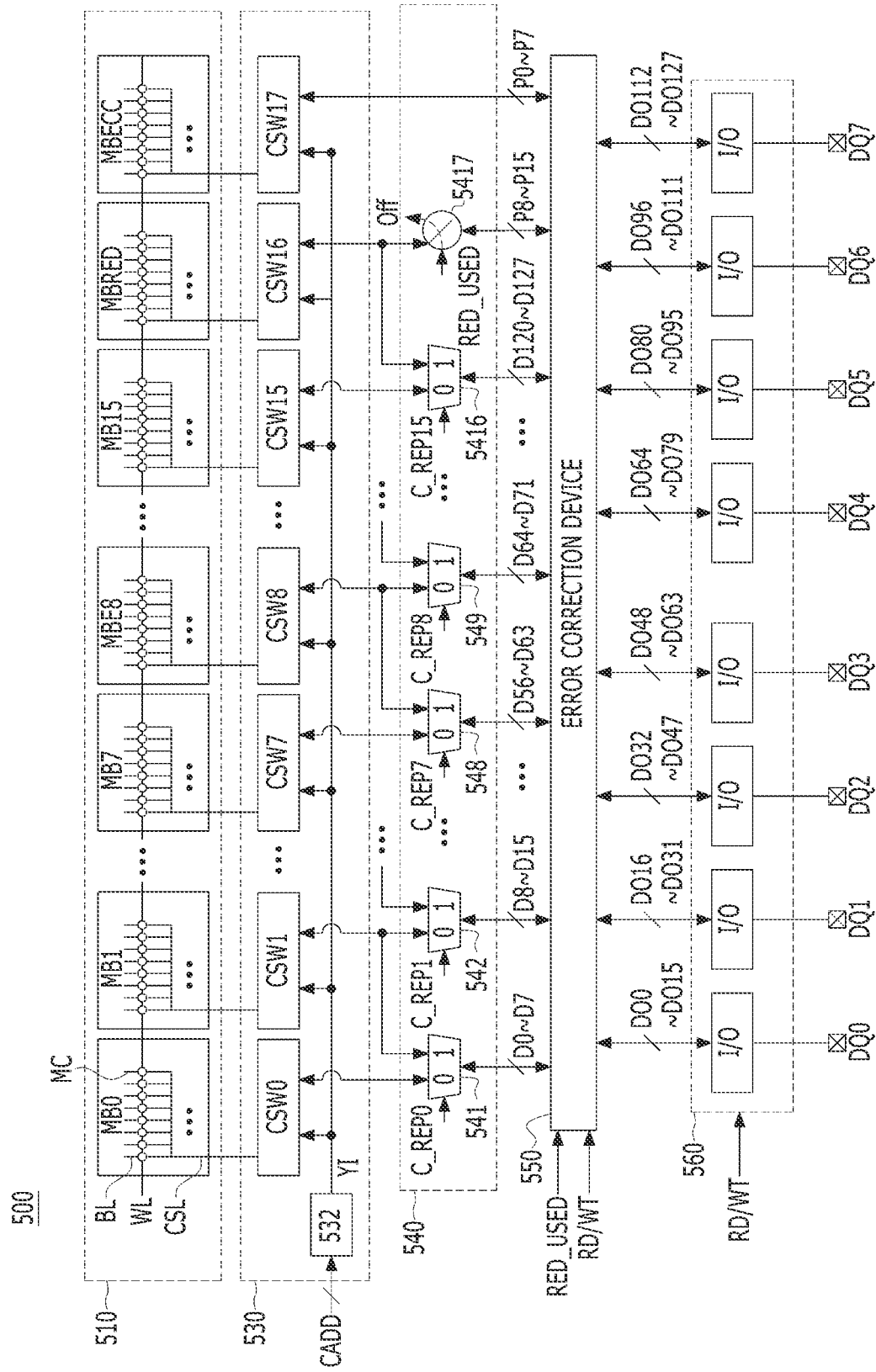
FIG. 11 is a diagram illustrating configurations of a memory device in more detail according to another embodiment of the present invention.

FIG. 11 is a diagram illustrating configurations of a memory device 500 in more detail according to another embodiment of the present invention.

Referring to FIG. 11, a memory cell array 510 may include first to 16-th normal cell blocks MB0 to MB15, a redundancy cell block MBRED, and an ECC cell block MBECC. The first to 16-th normal cell blocks MB0 to MB15 may store data D0 to D127 received from an external device through a data I/O circuit 560. The first to 16-th normal cell blocks MB0 to MB15 may be regions for storing user data, and are memory blocks for determining a memory capacity of the memory device 500. The redundancy cell block MBRED may be provided for a repair operation of the first to 16-th normal cell blocks MB0 to MB15, and may include a plurality of redundancy cells (e.g., redundancy bit lines) for replacing defective cells (e.g., defective bit lines) among the first to 16-th normal cell blocks MB0 to MB15. The ECC cell block MBECC may store first error correction codes P0 to P7 generated by an error correction device 550 for an error correction operation.

In an embodiment of the present invention, when the redundancy cell block MBRED is not used for the repair operation, a repair use signal RED_USED is deactivated, and thus the redundancy cell block MBRED may store second error correction codes P8 to P15 generated from the error correction device 550. In this case, the first to 16-th normal cell blocks MB0 to MB15, the redundancy cell block MBRED, and the ECC cell block MBECC may be sequentially disposed in a row direction.

A column control circuit 530 may include a column decoder 532 and first to 18-th column switches CSW0 to CSW17. Since the column control circuit 530 has substantially the same configuration as the column control circuit 130 of FIG. 2, a detailed description thereof will be omitted.

A repair control circuit 540 may include first to 16-th path selectors 541 to 5416 corresponding to the first to 16-th normal cell blocks MB0 to MB15, respectively. The first to 16-th path selectors 541 to 5416 may transfer data D0 to D127 and first error correction codes P0 to P7 between the corresponding cell blocks and one of the next cell blocks adjacent in the row direction in response to the first to 16-th block repair signals C_REP0 to C_REP15, respectively. In addition, the repair control circuit 540 may further include a path blocking switch 5417 for transferring second error correction codes P8 to P15 between the redundancy cell block MBRED and the error correction device 550 in response to the repair use signal RED_USED. The first to 16-th path selectors 541 to 5416 and the path blocking switch 5417 have substantially the same configurations as those of the repair control circuit 140 of FIG. 2, and thus a detailed description thereof will be omitted.

When the repair use signal RED_USED is activated, the error correction device 550 may generate 8-bit first error correction code P0 to P7 using 128-bit data DO0 to DO127 during a write operation, and correct the data D0 to D127 according to the 8-bit first error correction codes P0 to P7 during a read operation. On the other hand, when the repair use signal RED_USED is deactivated, the error correction device 550 may generate 16-bit first and second error correction codes P0 to P7 and P8 to P15 using the 128-bit data DO0~DO127 during the write operation, and may correct the data D0 to D127 according to the 16-bit first and second error correction codes P0 to P7 and P8 to P15 during the read operation. The error correction device 550 has substantially the same configuration as the error correction device 150 of FIGS. 4 to 8, and thus a detailed description thereof will be omitted.

The data I/O circuit 560 may correspond to data pads DO0 to DO7 and may input/output the 128-bit data DO0 to DO127 through the corresponding data pad. The data I/O circuit 560 has substantially the same configuration as the data I/O circuit 160 of FIG. 2, and thus a detailed description thereof will be omitted.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of this disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device comprising:
a plurality of first cell blocks configured to store first data;
a second cell block configured to store second data;
a third cell block configured to store third data;
a repair information storage circuit configured to output, based on repair information stored therein, a repair use signal corresponding to an input address; and
an error correction circuit configured to:
receive the second data as a first error correction code from the second cell block while selectively receiving, according to the repair use signal, the third data as a second error correction code from the third cell block, and
correct errors in the first data from the first cell blocks using the first and second error correction codes.

2. The memory device of claim 1,
wherein the error correction circuit is configured to correct the errors in the first data using the first error correction code when the repair use signal is activated, and
wherein the error correction circuit is configured to correct the errors in the first data using the first and second error correction codes when the repair use signal is deactivated.

3. The memory device of claim 1, wherein the repair information storage circuit includes:
a plurality of address storage circuits respectively corresponding to the first and second cell blocks, each address storage circuit being configured to store at least one defective address of a corresponding one of the first and second cell blocks; and
a signal generator configured to:
generate a plurality of block repair signal each activated according to a result of comparison between the input address and the defective address stored in a corresponding address storage unit, and
activate the repair use signal when one of the block repair signals is activated.

4. The memory device of claim 3, further comprising a repair control circuit configured to repair, according to the block repair signals, defective cells of the first and second cell blocks using cells of the third cell block.

5. The memory device of claim 4, wherein the repair control circuit includes:
a plurality of path selectors corresponding to the first and second cell blocks, each path selector being configured to transfer data between the error correction circuit and one of a corresponding one of the first and second cell blocks and an adjacent cell block of the corresponding cell block in response to a corresponding one of the block repair signals.

6. The memory device of claim 5, wherein the repair control circuit further includes a path blocking switch configured to transfer data between the third cell block and the error correction circuit in response to deactivation of the repair use signal.

7. The memory device of claim 1, wherein the error correction circuit includes:
a calculation circuit configured to generate a first preliminary error correction code using lower data among the first data, and generate a second preliminary error correction code using upper data among the first data;
a first decoding selector configured to select one of an all-zero code and the second preliminary error correction code according to the repair use signal;
a logic gate configured to output a third preliminary error correction code by performing a logic exclusive OR (XOR) operation on the first preliminary error correction code and the selected code;

a first syndrome generator configured to generate first syndrome data by comparing, on a bit-by-bit basis, the first error correction code with the third preliminary error correction code;

a second syndrome generator configured to generate second syndrome data by comparing, on a bit-by-bit basis, the second error correction code with the second preliminary error correction code;

a second decoding selector configured to output third syndrome data by selecting one of the first syndrome data and the second syndrome data according to the repair use signal; and an error corrector configured to correct the errors by detecting error positions of the lower data based on the first syndrome data and by detecting error positions of the upper data based on the third syndrome data.

8. The memory device of claim 1, further comprising an error correction code generation circuit configured to:

generate a first preliminary error correction code using lower data among input data, generate a second preliminary error correction code using upper data among the input data, and provide, according to the repair use signal, the first and second preliminary error correction codes respectively as the second and third data or a result of a comparison between the first and second preliminary error correction codes as the second data.

9. The memory device of claim 8, wherein the error correction code generation circuit includes:

a calculation circuit configured to generate the first and second preliminary error correction codes and output the second preliminary error correction code as the second error correction code;

an encoding selector configured to select one of an all-zero code and the second preliminary error correction code according to the repair use signal; and a logic gate configured to output the first error correction code by performing a logic exclusive OR (XOR) operation on the first preliminary error correction code and the selected code.

10. The memory device of claim 1, wherein the first cell blocks include first to 2m-th normal cell blocks, m being a natural number, and wherein the first to m-th normal cell blocks, the second cell block, the (m+1)-th to 2m-th normal cell blocks, and the third cell block are sequentially disposed in a first direction.

11. A memory device comprising:

a memory cell array including a plurality of normal cell blocks, an error correction code (ECC) cell block and a redundancy cell block; and an error correction circuit configured to:

receive data as a first error correction code from the ECC cell block while selectively receiving, according to a repair use signal indicating whether cells of the redundancy cell block are used In a repair operation, data as a second error correction code from the redundancy cell block, and correct errors in data read from the normal cell blocks using the first and second error correction codes.

12. The memory device of claim 11, wherein the error correction circuit is configured to correct the errors using the first error correction code when the repair use signal is activated, and wherein the error correction circuit configured to correct the errors using the first and second error correction codes when the repair use signal is deactivated.

13. The memory device of claim 11, further comprising an error correction code generation circuit configured to:

generate a first preliminary error correction code using lower data among input data, generate a second preliminary error correction code using upper data among the input data, and provide, according to the repair use signal, the first and second preliminary error correction codes respectively to the ECC cell block and the redundancy cell block, or a result of a comparison between the first and second preliminary error correction codes to the ECC cell block.

14. The memory device of claim 13, wherein the error correction code generation circuit provides, when the repair use signal is activated, the result by performing a logic exclusive OR (XOR) operation on the first and second preliminary error correction codes, and wherein the error correction circuit provides, when the repair use signal is deactivated, the first and second preliminary error correction codes respectively to the ECC cell block and the redundancy cell block.

15. The memory device of claim 11, wherein the normal cell blocks include first to 2m-th normal cell blocks, m being a natural number, and wherein the first to m-th normal cell blocks, the ECC cell block, the (m+1)-th to 2m-th normal cell blocks, and the redundancy cell block are sequentially disposed in a first direction.

16. An error correction device comprising:

an error correction code generation circuit configured to:

generate first and second preliminary error correction codes using lower data and upper data among input data, respectively, and provide, according to a repair use signal, the first and second preliminary error correction codes respectively to first and second cell blocks or a result of a comparison between the first and second preliminary error correction codes to the first cell block; and an error correction circuit configured to:

receive data read from the first cell block as a first error correction code while selectively receiving, according to the repair use signal, data read from the second cell block as a second error correction code, and correct errors in data read from third cell blocks using the first and second error correction codes.

17. The error correction device of claim 16, wherein the error correction code generation circuit provides, when the repair use signal is activated, the result by performing a logic exclusive OR (XOR) operation on the first and second preliminary error correction codes, and wherein the error correction circuit provides, when the repair use signal is deactivated, the first and second preliminary error correction codes respectively to the first and second cell blocks.

18. The error correction device of claim 16, wherein the error correction code generation circuit includes:

a calculation circuit configured to generate the first and second preliminary error correction codes and output the second preliminary error correction code as the second error correction code;

an encoding selector configured to select one of an all-zero code and the second preliminary error correction code according to the repair use signal; and a logic gate configured to output the first error correction code by performing a logic exclusive OR (XOR) operation on the first preliminary error correction code and the selected code.

19. The error correction device of claim 16,
wherein the error correction circuit is configured to correct the errors using the first error correction code when the repair use signal is activated, and
wherein the error correction circuit is configured to correct the errors using the first and second error correction codes when the repair use signal is deactivated.

20. The error correction device of claim 16, wherein the error correction circuit includes:
a calculation circuit configured to generate third and fourth preliminary error correction codes using lower and upper data among the data read from the third cell blocks, respectively;
a first decoding selector configured to select one of an all-zero code and the fourth preliminary error correction code according to the repair use signal;
a logic gate configured to output a fifth preliminary error correction code by performing a logic exclusive OR (XOR) operation on the third preliminary error correction codes and the selected code;
a first syndrome generator configured to generate first syndrome data by comparing, on a bit-by-bit basis, the first error correction code with the fifth preliminary error correction code;
a second syndrome generator configured to generate second syndrome data by comparing, on a bit-by-bit basis, the second error correction code with the fourth preliminary error correction code;
a second decoding selector configured to output third syndrome data by selecting one of the first syndrome data and the second syndrome data according to the repair use signal; and
an error corrector configured to correct the errors by detecting error positions of the lower data among the data read from the third cell block based on the first syndrome data, and detecting error positions of the upper data among the data read from the third cell block based on the third syndrome data.

21. The error correction device of claim 16, wherein the repair use signal is activated when cells of the second cell block are used to repair defective cells of the first and third cell blocks.

22. A memory device comprising:
a group of cell blocks configured to store data and a first error correction code (ECC) of a predetermined size;
a redundancy cell block configured to replace a defective cell block within the group while a control signal stays enabled, the group and the redundancy cell block sharing a word line;
an ECC codec circuit configured to:
generate, while the control signal stays enabled, the first ECC for the data to error-correct the data by the first ECC, and
generate, while the control signal stays disabled, the first ECC for one part of the data and a second ECC for the other part of the data to error-correct the data by the first and second ECCs; and
a control circuit configured to control, while the control signal stays disabled, the redundancy cell block to store the second ECC.

* * * * *